(12) United States Patent
Kim

(10) Patent No.: US 7,875,917 B2
(45) Date of Patent: *Jan. 25, 2011

(54) IMAGE SENSOR AND METHOD FOR MANUFACTURING THE SAME

(75) Inventor: Jong Man Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/326,797

(22) Filed: Dec. 2, 2008

(65) Prior Publication Data

US 2009/0166694 A1 Jul. 2, 2009

(30) Foreign Application Priority Data

Dec. 27, 2007 (KR) ............... 10-2007-0139466
Jun. 27, 2008 (KR) ............... 10-2008-0061474

(51) Int. Cl.
*H01L 31/062* (2006.01)

(52) U.S. Cl. .............. 257/292; 257/290; 257/293; 257/294; 257/444; 257/E25.032; 257/E31.058; 257/E27.133

(58) Field of Classification Search ......... 257/290, 257/292–294, 444, 458, 656
See application file for complete search history.

(56) References Cited

U.S. PATENT DOCUMENTS

| | | | |
|---|---|---|---|
| 5,936,261 A | 8/1999 | Ma et al. | |
| 7,785,916 B2* | 8/2010 | Jun | 438/69 |
| 7,795,069 B2* | 9/2010 | Jun | 438/96 |
| 2008/0093695 A1* | 4/2008 | Gao et al. | 257/428 |
| 2008/0246063 A1* | 10/2008 | Liu et al. | 257/290 |
| 2009/0065824 A1* | 3/2009 | Hwang | 257/292 |
| 2009/0065825 A1* | 3/2009 | Hwang | 257/292 |
| 2009/0065828 A1* | 3/2009 | Hwang | 257/292 |

FOREIGN PATENT DOCUMENTS

JP 2000-156488 A 6/2000

OTHER PUBLICATIONS

Korean Office Action; Korean Patent Application No. 10-2007-0139466, filed Apr. 26, 2008; Korean Intellectual Property Office, Republic of Korea.
Shawming MA and Jeremy A. Theil; "High-Performance Image Sensor Array"; Japan Abstract for Publication No. 2000-156488; Publication Date: Jun. 6, 2000; Japan Patent Office; Japan.

* cited by examiner

Primary Examiner—A. Sefer
(74) Attorney, Agent, or Firm—The Law Offices of Andrew D. Fortney; Andrew D. Fortney; Theresa J. Mahan

(57) ABSTRACT

An image sensor and a method for manufacturing the same are provided. In the image sensor, a semiconductor substrate has a pixel region and a peripheral region defined by a first device isolation layer. First and second photodiode patterns are formed on the pixel region and are connected to lower metal lines to first and second readout circuitries. The first photodiode pattern performs as an active photodiode and the second photodiode pattern functions as a dummy pixel. The dummy pixel can measure leakage current.

20 Claims, 5 Drawing Sheets

IMAGE SENSOR AND METHOD FOR MANUFACTURING THE SAME

CROSS-REFERENCE TO RELATED APPLICATIONS

The present application claims priority under 35 U.S.C. 119 to Korean Patent Application No. 10-2007-0139466 (filed on Dec. 27, 2007) and Korean Patent Application No. 10-2008-0061474 (filed on Jun. 27, 2008), which are hereby incorporated by reference in their entireties.

BACKGROUND

Embodiments of the invention relate to an image sensor and a method for manufacturing the same.

An image sensor is a semiconductor device that converts an optical image to an electric signal. Image sensors are generally classified into two categories: charge coupled device (CCD) image sensors and complementary metal oxide silicon (CMOS) image sensors (CIS).

In related art image sensors, photodiodes are formed in a substrate using ion implantation. As the semiconductor industry moves toward ultra-large scale integration, the sizes of photodiodes are progressively reduced to allow the number of pixels in a chip to be increased without an increase in a chip size. In turn, the area of a light receiving portion of the photodiodes may be reduced, which can result in poorer image quality.

Also, since the stack height of device layers over the photodiodes may not be reduced in proportion to the reduction in the area of the light receiving portion, the number of photons incident to the light receiving portion may also be reduced due to the diffraction of light, which results in a phenomenon called "airy disk".

Alternative methods intended to overcome this limitation include forming a photodiode using amorphous silicon (Si), or forming readout circuitry in a Si substrate (using a method such as wafer-to-wafer bonding) and forming a photodiode on the readout circuitry (referred to as a "three-dimensional (3D)" image sensor). The photodiode is connected with the readout circuitry through a metal line.

According to the related art, two or more insulating layers are formed over the photodiode so as to protect a surface of the photodiode. Since the protection insulating layers are formed of different materials, light incident on the protection insulating layers can be reflected or absorbed, reducing the sensitivity of the photodiode.

Also, in an image sensor according to the related art, leakage current is generated due to environmental elements such as temperature, which may cause a dark current in the photodiode.

In addition, according to the related art, since the source and drain of a transfer transistor connected to the photodiode are heavily doped with an N-type impurity, a charge sharing phenomenon may be generated. The generation of the charge sharing phenomenon may lower the sensitivity of an output image as well as generate an image error. Furthermore, according to the related art, since photo charges may not be transferred between the photodiode and the readout circuitry as efficiently as may be desired, dark current may be generated, or saturation and sensitivity may be lowered.

SUMMARY OF THE INVENTION

Embodiments of the present invention provide an image sensor and a method for manufacturing the same that can employ a vertical type photodiode and measure leakage current by forming a dummy pixel.

In one embodiment, an image sensor may comprise: a semiconductor substrate having a pixel region and a peripheral region defined by a first device isolation layer; first and second readout circuitries in the pixel region; an insulating layer including first, second, and third lower metal lines and a pad on the semiconductor substrate, the first and second lower metal lines being electrically connected to the first and second readout circuitries, respectively, and the third lower metal line being in the peripheral region; first and second photodiode patterns on the insulating layer and separated in each pixel by a gap region, the first and second photodiode patterns being electrically connected to the first and second lower metal lines, respectively; a second device isolation layer on or over the insulating layer and the first and second photodiode patterns; an upper metal line on the second device isolation layer, connected with the first photodiode pattern and the third lower metal line; a pad hole in the second device isolation layer and the insulating layer to expose the pad; and a passivation layer over the insulating layer including the upper metal line.

In another embodiment, a method for manufacturing an image sensor may comprise: forming a device isolation layer in a semiconductor substrate, the device isolation layer defining a pixel region and a peripheral region; forming first readout circuitry and second readout circuitry on/in the pixel region of the semiconductor substrate; forming an insulating layer on the semiconductor substrate including first and second lower metal lines, a third lower metal line on the peripheral region, and a pad; forming a crystalline photodiode layer on the insulating layer on the pixel region; forming a gap region in the photodiode layer to form a first photodiode pattern and a second photodiode pattern separated in each pixel by the gap region and connected with the first readout circuitry and the second readout circuitry, respectively; forming a second device isolation layer on or over the insulating layer and the first and second photodiode patterns; forming an upper metal line on the second device isolation layer, connected with the first photodiode pattern and the third lower metal line; forming a pad hole in the second device isolation layer and the insulating layer to expose the pad; and forming a passivation layer over the insulating layer and the upper metal line.

The details of one or more embodiments are set forth in the accompanying drawings and the description below. Other features will be apparent from the description and drawings, and from the claims.

DETAILED DESCRIPTION OF THE EMBODIMENTS

An image sensor and a manufacturing method thereof according to embodiments of the present invention will be described in detail with reference to the accompanying drawings.

First Embodiment(s)

Figure 9:
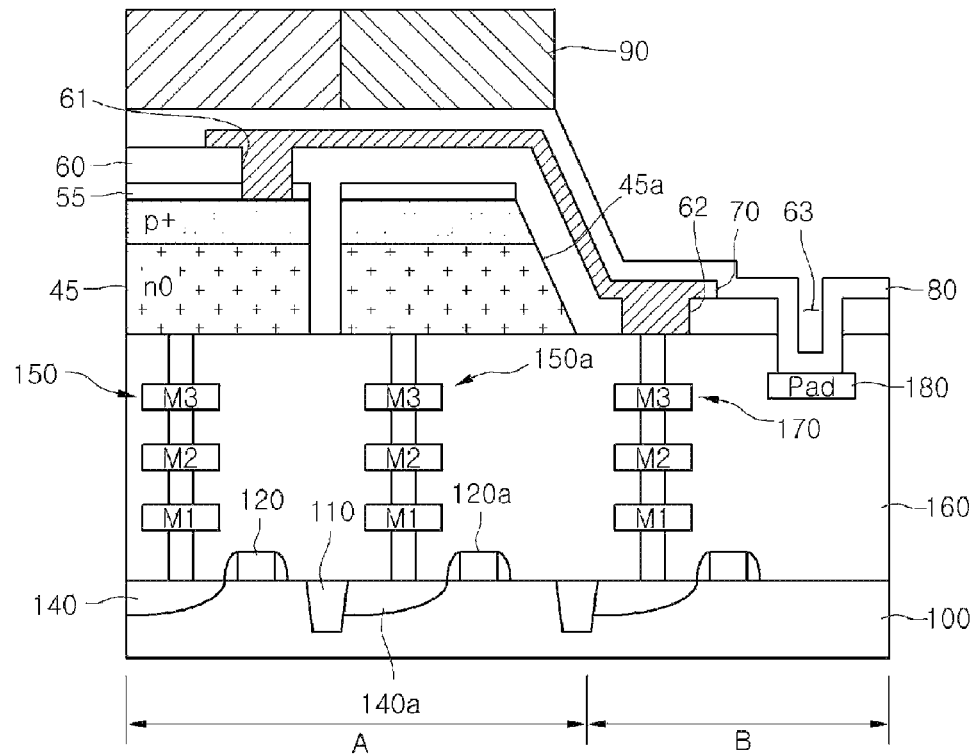

FIG. 9 is a sectional view of an image sensor according to one or more embodiment(s).

The image sensor according to the first embodiment(s) may include: a semiconductor substrate 100 having a pixel region A and a peripheral region B defined by a first device isolation layer 110; first and second readout circuitries (e.g., 120, 120a) formed in the pixel region A; an insulating layer 160 including lower metal lines 150, 150a and a pad 180 formed on or over the semiconductor substrate 100; first and second photodiode patterns 45, 45a on the insulating layer 160 and separated in each pixel by a gap region 25 such that the first and second photodiode patterns 45 and 45a are connected with the lower metal lines 150 and 150a, respectively, and (indirectly) connected with the first and second readout circuitries 120 and 120a, respectively; a second device isolation layer 60 over the insulating layer 160 including the first and second photodiode patterns 45, 45a; an upper metal line 70 formed on or over the second device isolation layer 60 such that the upper metal line 70 is connected with the first photodiode pattern 45 and a lower metal line 170 of the peripheral region B; a pad hole 63 formed in the second device isolation layer 60 and the insulating layer 160 to expose the pad 180; and a passivation layer 80 formed over the insulating layer 160 on which the upper metal line 70 and in which the pad hole 63 are formed.

The passivation layer 80 may be formed on the pad 180 through the pad hole 63. For example, the passivation layer 80 may have a thickness in a range of 1000~2000 Å.

The upper metal line 70 may be electrically connected with the first photodiode pattern 45 through a first via hole 61. Also, the upper metal line 70 may be electrically connected with the lower metal line 170 of the peripheral region B through a second via hole 62. Although not shown in the drawings, the upper metal line 70 may have a mesh type form, and may be selectively connected with the first photodiode pattern 45 and the lower metal line 170 of the peripheral region B. That is, the upper metal line 70 may be formed so as not to cover a light receiving region of the first photodiode pattern 45. The upper metal line 70 may be connected from the first via hole 61 to the second via hole 62 to cover the second photodiode pattern 45a.

The first photodiode pattern 45 is a main pixel, which is connected with the upper metal line 70 and performs a photodiode operation. The second photodiode pattern 45a is a dummy pixel, which is not connected with the upper metal line 70. The upper metal line 70 is used as a reset line. That is, since the second photodiode pattern 45a can exclude a leakage factor of the upper metal line 70, it is possible to estimate and/or correctly measure the leakage current. Accordingly, the second photodiode pattern 45a may be used as a reference pixel for measuring or estimating the leakage current.

The first and second readout circuitries 120, 120a of the semiconductor substrate 100 may include an electrical junction region 140 formed in the semiconductor substrate 100.

The image sensor according to first embodiment(s) can enhance the sensitivity by vertically integrating the readout circuitries and the photodiode, and forming the passivation layer for protecting the photodiode and the pad in a single layer.

Of the reference numerals shown in FIG. 9, undescribed numerals will be described later in the section of a manufacturing method.

A method for manufacturing an image sensor according to exemplary embodiment(s) will now be described with reference to FIGS. 1 to 9.

Figure 1:
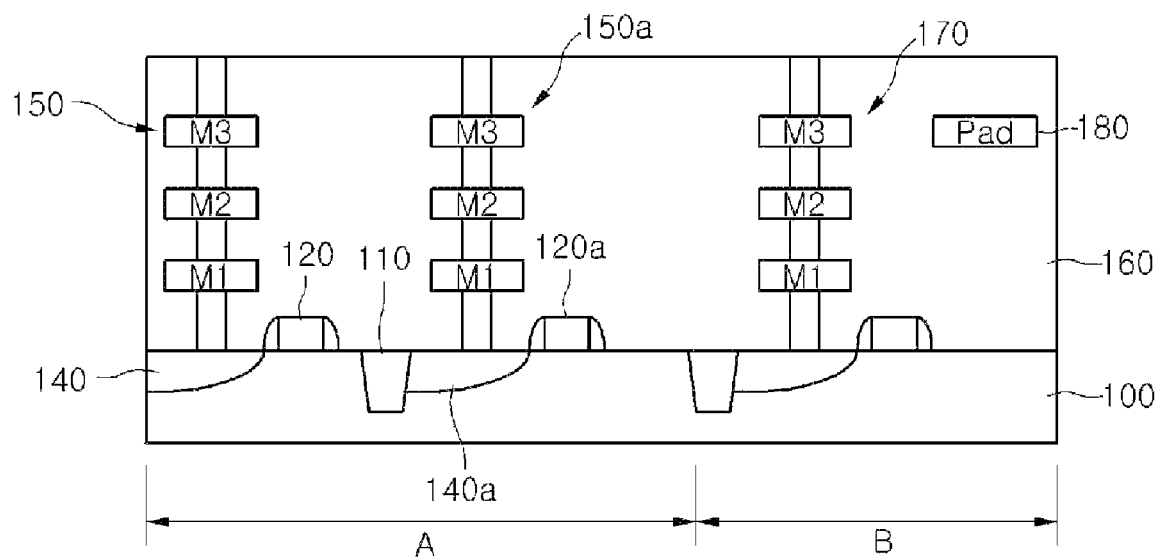
FIGS. 1 to 9 are cross-sectional views illustrating an exemplary method for manufacturing an image sensor according to various embodiments.

Referring to FIG. 1, first and second readout circuitries 120, 120a are formed in a pixel region A of a semiconductor substrate 100. Also, a stacked insulating layer 160 is formed over the pixel region A and the peripheral region B of the semiconductor substrate 100. The insulation layer 160 may comprise multiple dielectric layers (e.g., silicon dioxide, silicon nitride, or combinations thereof). Lower metal lines 150, 150a, and 170 may be formed in the insulating layer 160 dielectric stack by conventional photolithography and deposition techniques. The lower metal lines 150 and 150a may be connected with the readout circuitries 120 and 120a respectively.

The first and second readout circuitries 120, 120a and the lower metal lines 150, 150a will now be described with reference to FIG. 2. Since the first and second readout circuitries 120, 120a have the same constitution, only the first readout circuitry 120 will be described.

Figure 2:
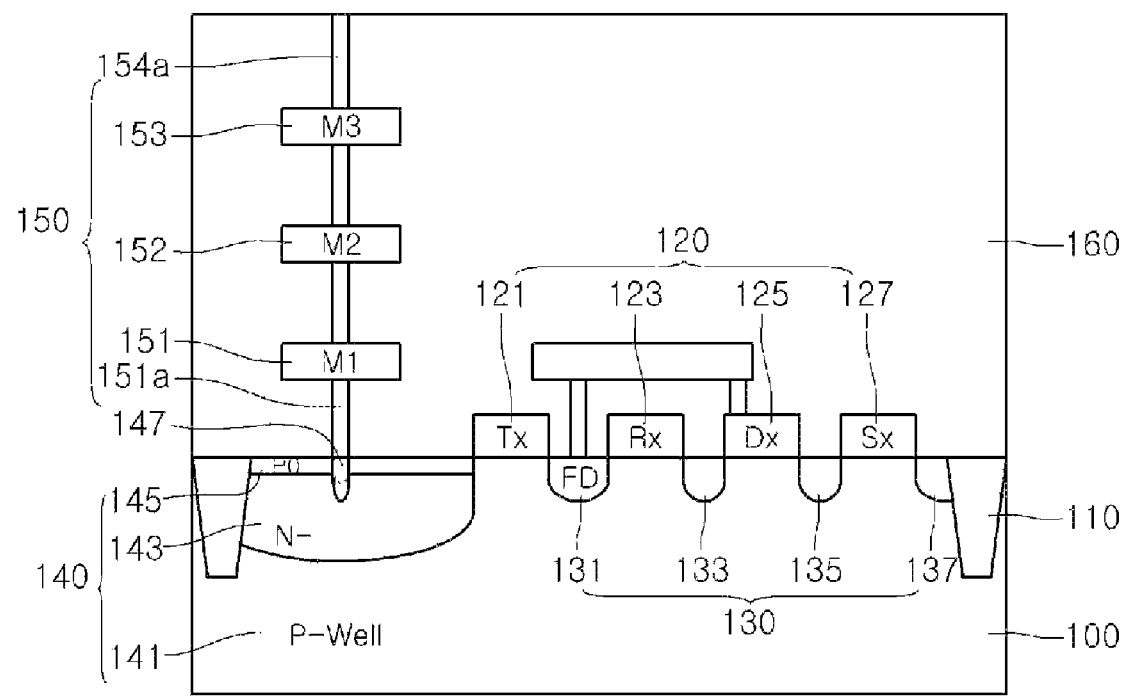

As shown in FIG. 2, an active region is defined by forming a device isolation layer 110 in a second conductive type semiconductor substrate 100, and then the first readout circuitry 120 including a transistor in each pixel is formed in the active region. The first readout circuitry 120 may include, for example, an optional transfer transistor (Tx) 121, a reset transistor (Rx) 123, a drive transistor (Dx) 125, and a select transistor (Sx) 127. Thereafter, an ion implantation region 130 including a floating diffusion region (FD) 131 and source/drain regions 133, 135, 137 for each transistor may be formed by conventionally implanting a heavy dose of N-type ions.

Forming the first readout circuitry 120 in the semiconductor substrate 100 may further include forming an electrical junction region 140 in the semiconductor substrate 100 and forming a first conductive type connection region 147 connected with the lower metal line 150 on the electrical junction region 140. For example, the electrical junction region 140 may be a PN junction 140, but the present invention is not limited thereto. For example, the electrical junction region 140 may include a first conductive type ion implantation layer 143 formed on a second conductive well 141 or a second conductive type epitaxial (epi) layer, and a second conductive type ion implantation layer 145 formed on the first conductive type ion implantation layer 143. For example, the PN junction 140 may be P0(145)/N−(143)/P−(141) junction as shown in FIG. 2, but the present invention is not limited thereto. The semiconductor substrate may be doped with a second conductive type impurity, but the present invention is not limited thereto.

According to the first embodiment(s), it may be possible to fully dump or transfer photo charges by designing the image sensor such that there exists a potential difference between the source and drain of the transfer transistor (Tx). By doing so, the photo charges generated in the photodiode can be dumped or transferred into the floating diffusion region, thereby enhancing the sensitivity of the image sensor (and output images thereof). That is, in the first embodiment(s), by forming the electrical junction region 140 in the semiconductor substrate 100 having the first readout circuitry 120 formed thereon and thus generating a potential difference between source and drain of the transfer transistor (Tx), it may be possible to fully dump or transfer the photo charges.

Hereinafter, a structure that transfers the photo charges according to the first embodiment(s) will be described in detail.

In the first embodiment(s), unlike the floating diffusion (FD) 131 node that is an N+ junction, the electrical junction region 140, i.e., P/N/P junction does not fully receive an applied voltage, but is pinched off at a constant voltage.

This voltage is called a 'pinning voltage', which depends on doping concentrations of P0 145 and P− 143.

Specifically, electrons generated in the photodiode 45 (see FIG. 9) move to the PNP junction region 140, and when the transfer transistor (Tx) 121 is turned on, the electrons are transferred to the FD 131 node and converted to a voltage.

Since a maximum voltage value of the P0/N−/P− junction 140 becomes the pinning voltage and a maximum voltage value of the FD 131 node becomes Vdd minus the threshold voltage (Vth) of the reset transistor (Rx), the electrons generated in the photodiode 45 on a chip can be fully transferred into the FD 131 node without charge sharing due to a potential difference between source and drain of the transfer transistor (Tx) 131. That is, the P0/N−/Pwell junction is formed in the semiconductor substrate 100 (i.e., Si-Sub, rather than a N+/Pwell junction) because in a 4-transistor APS Reset operation, a positive (+) voltage is applied to N− 143 of the P0/N−/Pwell junction and ground voltage is applied to P0 145 and Pwell 141. Thus, when a voltage greater than the constant voltage is applied, the P0/N−/Pwell double junction is pinched off like in a bipolar junction transistor (BJT) structure. This is called the "Pinning voltage". Accordingly, a potential difference between source and drain of the transfer transistor (Tx) 121 is generated, and thus, when the transfer transistor (Tx) is turned on/off, a charge sharing phenomenon can be prevented.

Accordingly, unlike in the related art, wherein the photodiode is connected to N+ junction, the present embodiment can avoid reduction(s) in the saturation and sensitivity.

Next, according to the first embodiment(s), the first conductive type connection region 147 is formed between the photodiode and the readout circuitry to help smooth or facilitate movement of photo charges, thereby minimizing a source of dark current and preventing diminution of the saturation and sensitivity of the photodiode.

For these purposes, in the first embodiment(s), the first conductive connection region 147 may form as an ohmic contact in the surface of the P0/N−/P− junction 140. The N+ region 147 may penetrate the P0 region 145 and contact the N− 143.

Meanwhile, to minimize current leakage from the first conductive type connection region 147, the width of the first conductive type connection region 147 may be minimized. For this purpose, a contact hole for a first metal contact 151a is first etched into a lower most sublayer of the insulating layer 160 and then a plug implant is performed, but the present invention is not limited thereto. For example, the first conductive type connection region 147 may be formed by first forming an ion implantation pattern (not shown) by photolithography using a photoresist and using the ion implantation pattern as an ion implantation mask.

That is, to minimize a dark signal and form the ohmic contact smoothly, N+ doping is locally performed in the contact hole for the first metal contact 151a, as described above. If N+ doping is performed to the entire region of source of the transfer transistor (Tx) like in the related art, dark signal may be increased due to Si surface dangling bonds.

Next, an insulating layer 160 (as shown in FIGS. 1-2) may be formed on the semiconductor substrate 100 by depositing a plurality of dielectric layers (e.g., silicon dioxide, silicon nitride, or combinations thereof). Each of the plurality of dielectric layers may correspond to metals (e.g., M1) of lower metal lines 150, 150a, and 170. Each dielectric layer may comprise a lowermost, conformal etch stop layer (e.g., silicon nitride), a conformal buffer and/or gap-fill layer (e.g., silicon-rich oxide [SRO], TEOS [e.g., a silicon oxide formed by CVD from tetraethyl orthosilicate and oxygen], an undoped silicate glass [USG] or a combination thereof), a bulk dielectric layer (e.g., one or more silicon oxide layers doped with fluorine [e.g., a fluorosilicate glass or FSG], boron and/or phosphorus [BSG, PSG and/or BPSG]), and a capping layer (e.g., of TEOS, USG, a plasma silane [e.g., silicon dioxide formed by plasma-assisted CVD of silicon dioxide from silane and oxygen], or a combination thereof, such as a bilayer of plasma silane on USG or TEOS, or a bilayer of USG on TEOS).

Lower metal lines 150, 150a, and 170 are formed in the insulating layer 160 in a sequential manner (see, e.g., FIGS. 1-2). Each of the lower metal lines 150, 150a, and 170 may include a first metal contact (e.g., 151a), a first metal (M1) (e.g., 151), a second metal contact, a second metal (M2) (e.g., 152), a third metal contact, a third metal (M3) (e.g., 153) and a fourth metal contact (e.g., 154a), but the present invention is not limited thereto.

The metal lines 150, 150a, and 170 (metals M1, M2, and M3, respectively) and the metal contacts between the metals for connection to electrical junction regions (e.g., 140 and 140a) are generally surrounded by insulating layer 160. Each metal (e.g., M1, M2, M3) may comprise sputter-deposited aluminum or aluminum alloy (e.g., Al with up to 4 wt. % Cu, up to 2 wt. % Ti, and/or up to 1 wt. % Si), on conventional adhesion and/or barrier layers (e.g., Ti and/or TiN, such as a TiN-on-Ti bilayer), and/or covered by conventional adhesion, barrier, hillock suppression, and/or antireflective layers (e.g., Ti, TiN, WN, TiW alloy, or a combination thereof, such as a TiN-on-Ti bilayer or a TiW-on-Ti bilayer). The metals are in and/or on each layer of the insulating layer 160, and M1, M2, and M3 are electrically connected to each other through the metal contacts formed between the metals, as shown in FIGS. 1-2. The metal contacts may each comprise tungsten (deposited by chemical vapor deposition [CVD]) or aluminum or aluminum alloy (e.g., as described above, deposited by sputtering), on conventional adhesion and/or barrier layers (e.g., Ti and/or TiN, such as a TiN-on-Ti bilayer). The Ti, TiN and TiW layers may be deposited by CVD or sputtering.

Referring to FIGS. 1 and 2, the lower metal lines 150, 150a correspond to the unit pixel and the dummy pixel, respectively. The lower metal lines 150, 150a can connect the photodiodes 45, 45a with the first and second readout circuitries 120, 120a to deliver the photo charges from the photodiode 45 and the "dark current" from photodiode 45a, respectively. While the lower metal lines 150, 150a connected with the first and second readout circuitries 120, 120a are formed, one or more lower metal lines 170 of the peripheral region B may be formed simultaneously. The lower metal lines 150, 150a, 170 may comprise of various conductive materials including metals, alloys, and/or silicides, as described herein.

The lower metal line 150 connected with the first readout circuitry 120 of the pixel region A is connected with the main pixel, performing a substantial operation, and the lower metal line 150a connected with the second readout circuitry 120a is connected with the dummy pixel. Also, when the third metal 153 of the lower metal line 150 is formed, a pad 180 may be simultaneously formed in the peripheral region B.

Figure 3:
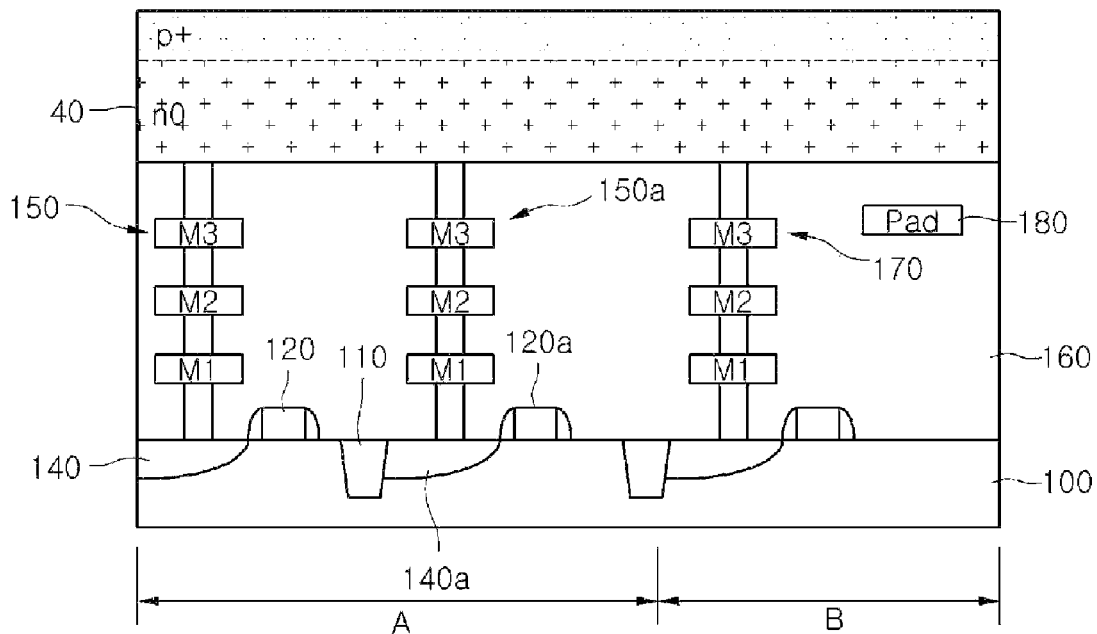

Referring to FIG. 3, a photodiode layer 40 is formed on the insulating layer 160. The photodiode layer 40 may include an n-type impurity region n0 and a p-type impurity region p+. Accordingly, the photodiode layer 40 may have a PN junction.

The photodiode layer 40 may be formed by performing an ion implantation process on a crystalline carrier. Although not shown in the drawings, the crystalline carrier may comprise a single crystalline substrate or polycrystalline silicon layer, either of which may be doped with a p-type impurity or n-type impurity.

The photodiode layer 40 may be formed by first implanting an n-type impurity into the crystalline carrier and then forming a shallow p-doped area at the surface of the substrate by implanting a p-type impurity. Accordingly, the photodiode layer 40 may have a PN junction, as shown in FIG. 3. When the crystalline carrier comprises a single crystal from which the photodiode layer 40 is formed, it may be coupled with or bonded to the semiconductor substrate 100 by a bonding process, and the crystalline carrier is subsequently partially removed such that the first and second photodiode patterns 45, 45a remain.

According to one embodiment, the n-type impurity layer is thicker than the p-type impurity layer, thereby increasing a charge storing capacity. That is, the n-type impurity layer may be thicker than the p-type impurity layer to increase the surface area, thereby enhancing the capacity to store photons.

Thus, the photodiode layer 40 is formed on the semiconductor substrate 100 to achieve vertical integration.

Figure 4:
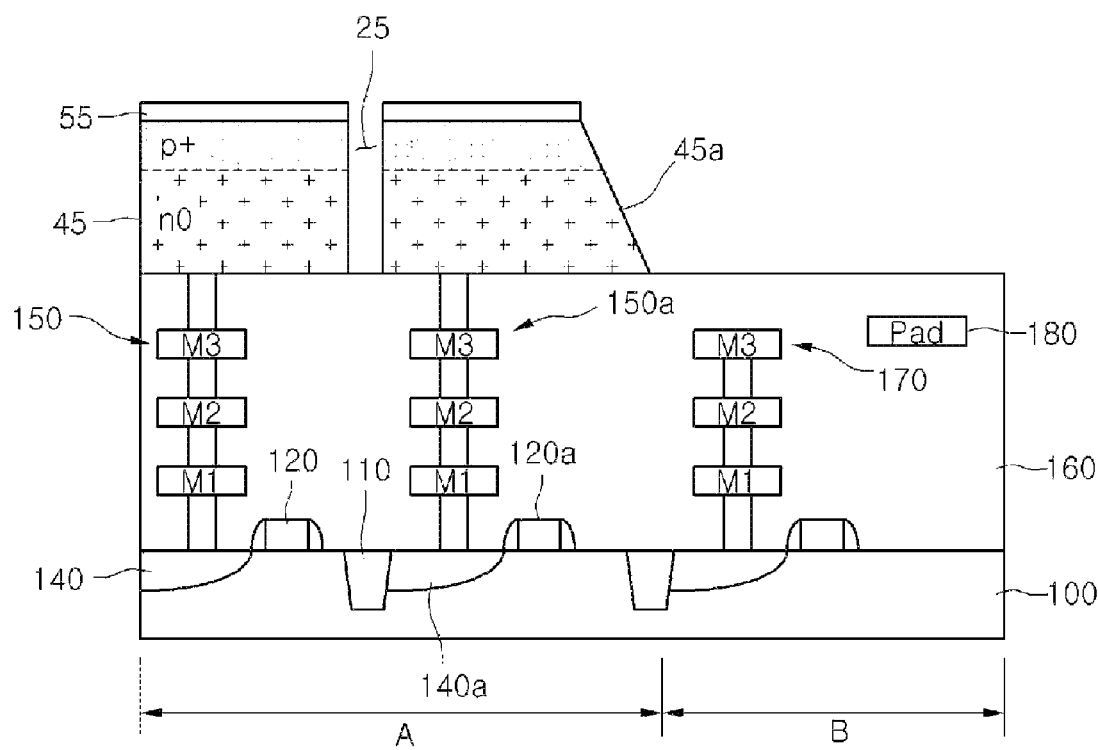

Referring to FIG. 4, first and second photodiode patterns 45, 45a are formed on the insulating layer 160 of the pixel region A.

The first and second photodiode patterns 45, 45a may be formed by forming a hard mask 55 on the photodiode layer 40 and etching the photodiode layer 40 using the hard mask 55 as an etching mask. The hard mask 55 may comprise an oxide such as TEOS and may be formed by blanket depositing the oxide by chemical vapor deposition (CVD), depositing a photoresist thereon, photolithographically patterning the photoresist, and etching the portions of the oxide exposed by the patterned photoresist. The hard mask 55 is used to pattern the photodiode layer 40 to form first and second photodiode patterns 45, 45a in the unit pixel. The first and second photodiode patterns 45, 45a are formed to correspond to the lower metal lines 150, 150a, respectively. The first and second photodiode patterns 45, 45a are formed are then formed by etching the photodiode layer 40 using the hard mask 55 as an etch mask. A gap region 25 may be formed between the first and second photodiode patterns 45 and 45a. The gap region 25 may selectively expose the insulating layer 160.

Accordingly, the first and second photodiode patterns 45 and 45a are separated, and are thus in separate pixels, by the gap region 25, and can be connected with the lower metal lines 150 and 150a, respectively. At this time, the first photodiode pattern 45 connected with the lower metal line 150 may comprise parts of a unit pixel that substantially operates as a light sensor, and the second photodiode pattern 45a connected with the lower metal line 150a may operate a dummy pixel.

Also, the portion of the photodiode layer 40 over the peripheral region B is removed, so that the insulating layer 160 and the lower metal line 170 corresponding to the peripheral region B are exposed.

Figure 5:
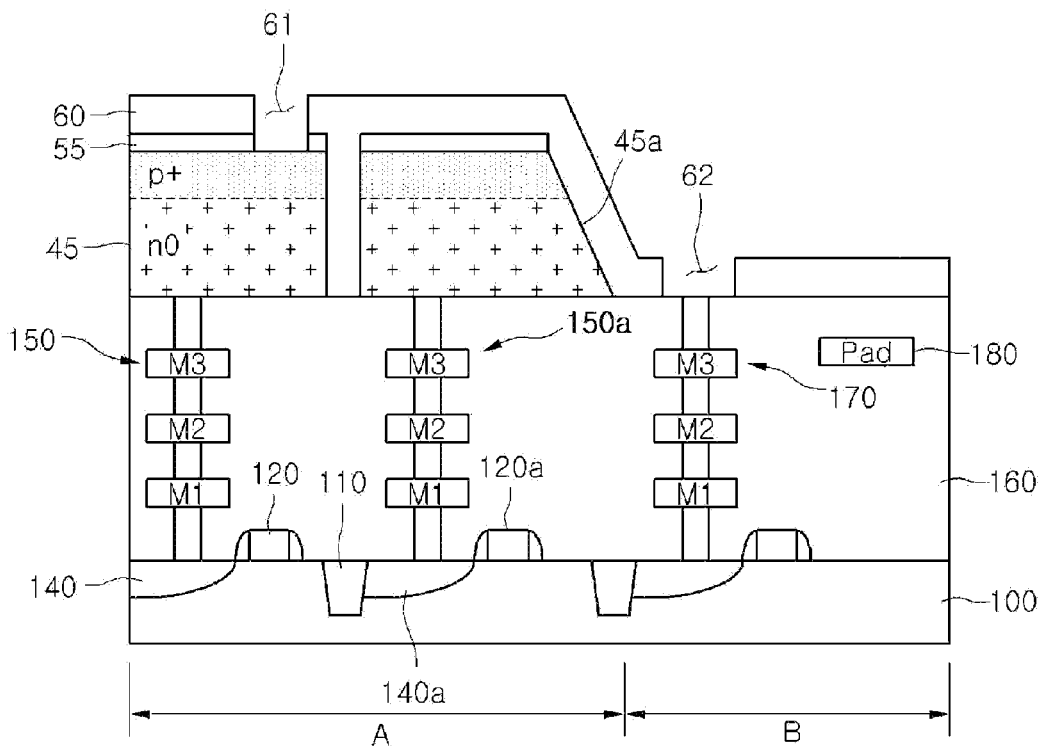

Referring to FIG. 5, a second device isolation layer 60 is formed on the insulating layer 160 on which the first and second photodiode patterns 45, 45a are formed. The second device isolation layer 60 may comprise an insulator such as oxide (e.g., $SiO_2$). The device isolation layer 60 is formed on the insulating layer 160 while filling the gap region 25. Accordingly, the first and second photodiode patterns 45 and 45a can be insulated and/or electrically isolated by the second device isolation layer 60.

Also, the device isolation layer 60 is formed on entire upper surfaces of the insulating layer 160 and the first and second photodiode patterns 45, 45a. Accordingly, the second device isolation layer 60 can protect the surfaces of the first and second photodiode patterns 45, 45a and elements formed in the peripheral region B.

Next, a first via hole 61 exposing a portion of the first photodiode pattern 45 and a second via hole 62 exposing the lower metal line 170 of the peripheral region B are formed. The first and second via holes 61, 62 may be formed by partially removing the device isolation layer using photolithography.

Figure 6:
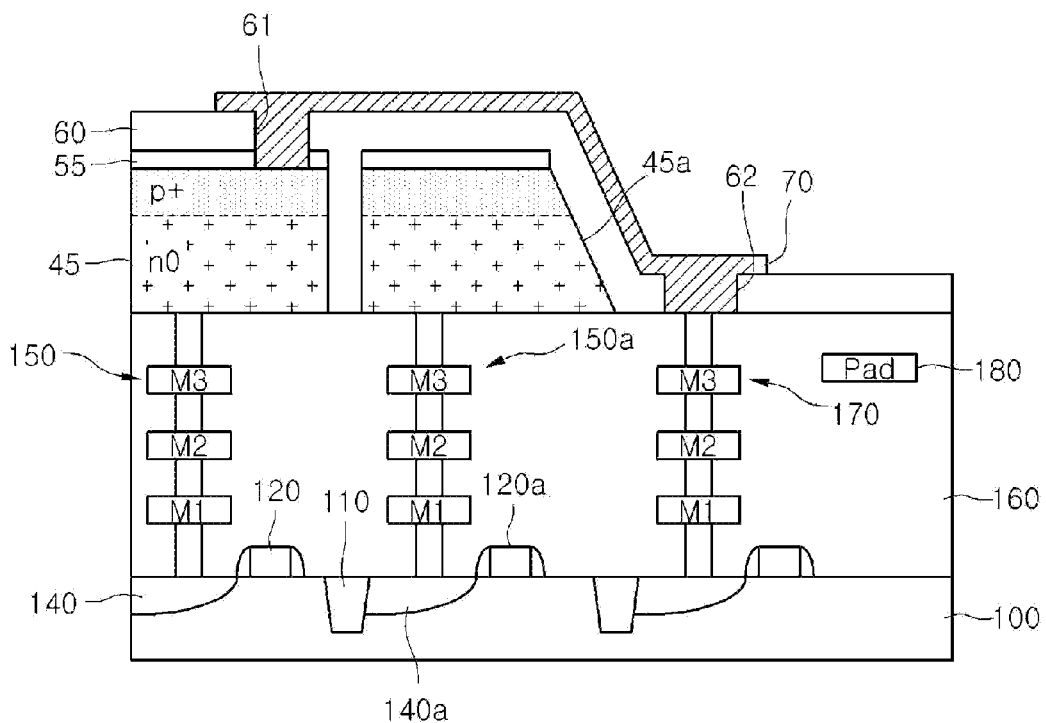

Referring to FIG. 6, an upper metal line 70 is formed on the second device isolation layer 60, and fills the first and second via holes 61 and 62. The upper metal line 70 may be formed by depositing a conductive material layer on the second device isolation layer 60 including the first and second via holes 61 and 62. For example, the upper metal line 70 may comprise one or more conductive materials such as Ti, Al, Cu, Co, or W.

The upper metal line 70 may be electrically connected with the first photodiode pattern 45 through the first via hole 61. Also, the upper metal line 70 may be electrically connected with the lower metal line 170 of the peripheral region B through the second via hole 62.

Although not shown in the drawings, the upper metal line 70 may be pattern so as not to cover the light receiving region of the first photodiode pattern 45. That is, the light receiving region may be exposed by selectively removing a portion of the upper metal line 70 over the first photodiode pattern 45. Also, the upper metal line 70 may be patterned so as to expose a portion of the second device isolation layer 60 located above the pad 180.

The upper metal line 70 is connected with the first photodiode pattern 45, but not the second photodiode pattern 45a. Thus, the first photodiode pattern 45 functions as a light sensor, and the second photodiode pattern 45a acts as a dummy pixel. Measuring a leakage current in an operational photodiode may be affected by the leakage current between the lower metal line and the upper metal line. However, in the present embodiment(s), leakage current generally is not generated by the lower metal line 150a, and the dummy pixel is not connected with the upper metal line 70, which functions as a reset line. That is, since the leakage current from the reset line can be excluded from the measurement of the current in the dummy pixel, it is possible to correctly measure (or more accurately estimate) the leakage current in the operating photodiodes. Since the leakage current directly affects the dark signal (i.e., photocharges that are generated or a signal that occurs when the pixel is turned off), the second photodiode pattern 45a can be used as a dummy pixel (e.g., a reference pixel) to measure the dark signal.

Also, since the upper metal line 70 connects the first via hole 61 with the second via hole 62, the second photodiode pattern 45a may be covered. That is, since light incident onto the second photodiode pattern 45a is blocked, it is possible to improve the output image (which can be adversely affected by a hot pixel) by comparing the signal at room temperature with a signal at a high temperature.

Figure 7:
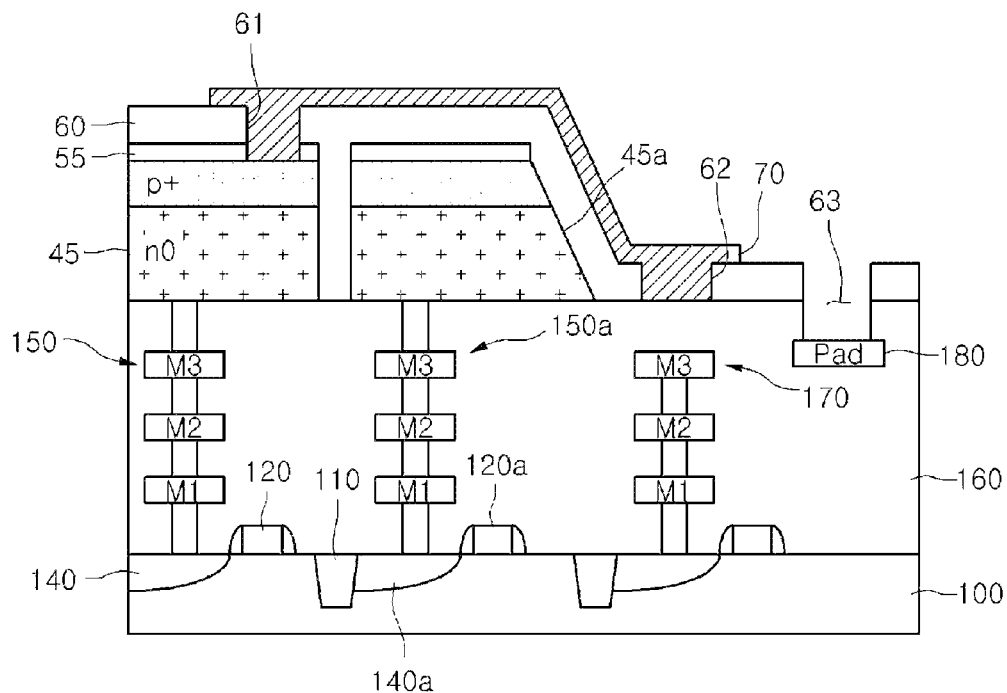

Referring to FIG. 7, a pad hole 63 exposing the pad 180 is formed in the second device isolation layer 60 and the insulating layer 160. The pad hole 63 may be formed by forming a photoresist film (not shown) on the second device isolation layer 60 and etching the second device isolation layer 60 using photolithography. The pad hole 63 exposes the pad 180.

Figure 8:
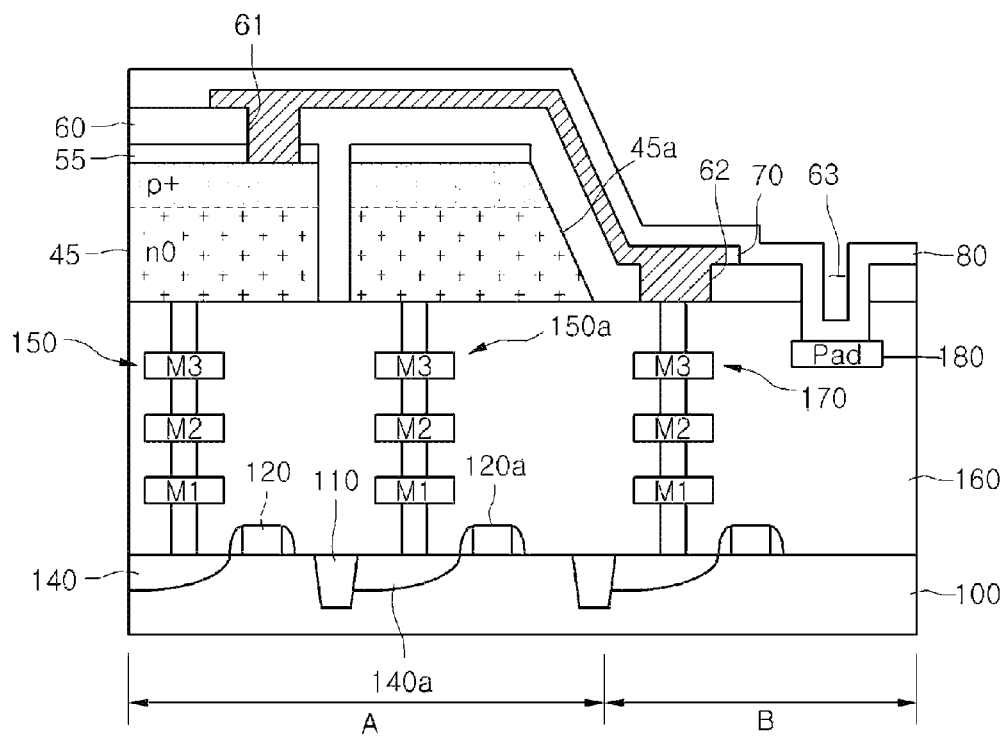

Referring to FIG. 8, a passivation layer 80 is formed over the insulating layer 160, including the pad hole 63. For example, the passivation layer 80 may be formed by depositing an oxide such as TEOS at a thickness in the range of 100~2000 Å. Since the TEOS passivation layer is formed on the upper metal line 70, the upper metal line 70 can be insulated. Also, the passivation layer 80 protects the first and second photodiode patterns 45, 45a. Further, the passivation layer 80 can prevent the pad 180 from being contaminated during a subsequent color filter forming process. Additionally, since the passivation layer 80 may have in a single layer, the thickness of the image sensor can be decreased, thereby allowing miniaturization of the image sensor. Moreover, since the passivation layer 80 may comprise a single layer of oxide, reflection and refraction of incident light may be decreased, thereby enhancing the sensitivity.

Referring to FIG. 9, a color filter 90 is formed on the passivation layer 80 over the first and second photodiode patterns 45, 45a. The color filter 90 is formed in each unit pixel to filter certain and/or predetermined colors from incident light. Although not shown in the drawings, a microlens may be further formed on each of the color filters 90.

According to the above method for manufacturing an image sensor, since the photodiode is formed on the semiconductor substrate on which the readout circuitry is formed, a vertical integration of the image sensor can be achieved.

Also, since the main pixel performing light sensing operations and the dummy pixel used as a reference pixel are formed, the performance of the image sensor can be enhanced.

Further, since the passivation layer may comprise or consist essentially a single layer between the photodiode and the color filter, the sensitivity can be enhanced.

Second Embodiment(s)

Figure 10:
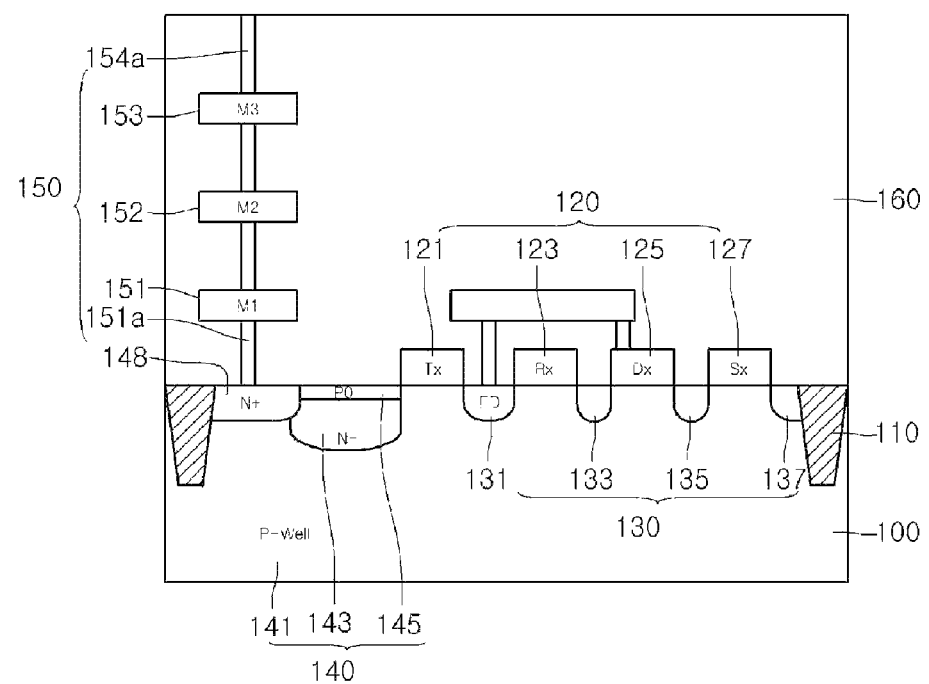
FIG. 10 is a partial, detailed view of an image sensor according to another embodiment.

FIG. 10 is a partial detailed view of an image sensor according to one or more second embodiment(s).

The image sensor according to the second embodiment(s) may include: a semiconductor substrate 100 having first and second readout circuitries 120, 120a formed thereon; first and second metal lines 150, 150a formed on the semiconductor substrate 100 and electrically connected with the first and second readout circuitries 120, 120a, respectively; and first and second photodiode patterns 45, 45a electrically connected with the first and second metal lines 150, 150a, respectively, and formed over the semiconductor substrate 100.

The second embodiment(s) can employ the technical features of the first embodiment(s).

For example, the first photodiode pattern 45 of the second embodiment is a main pixel connected with the upper metal line 70 to perform a substantial operation (e.g., light sensing). The second photodiode pattern 45a may be a dummy pixel, which is not connected with the upper metal line 70, and act as a reference pixel. Also, the passivation layer 80 can be a single layer on the upper metal line 70 to protect the image sensor and prevent the pad from being contaminated during subsequent processing.

Unlike the first embodiment(s), the second embodiment(s) include a first conductive type connection region 148 formed at one side of the electrical junction region 140.

According to the one embodiment, an N+ connection region 148 for an ohmic contact may be formed in the P0/N−/P− junction 140. The N+ connection region 148 and an M1 contact 151a may act as a leakage source. This is because in operation, a reverse bias may be applied to the P0/N−/P− junction 140, and an electric field EF can be generated in a surface layer of the Si substrate. Under the generated electric field, crystal defect(s) that may be generated while forming the contact may act as a leakage source.

Also, in the case where the N+ connection region 148 is formed on a surface of the P0/N−/P− junction 140, an additional electric field can be generated by the N+/P0 junction 148/145, which may also act as a leakage source.

Accordingly, a layout may be provided in which an N-type ohmic contact is not formed in the P0 layer, a first contact plug 151a is formed in contact with the N+ connection region 148, and the first contact plug 151a is electrically connected to the N− junction 143. Thus, an electric field in a surface layer of the silicon substrate can be avoided, which can otherwise contribute to a decrease in the dark current of the 3-D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the understanding of one skilled in the art that such feature, structure, or characteristic may be combined with aspects of other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a semiconductor substrate having a pixel region and a peripheral region defined by a first device isolation layer;
first and second readout circuitries in the pixel region;
an insulating layer including first, second, and third lower metal lines and a pad on the semiconductor substrate, the first and second lower metal lines being electrically connected to the first and second readout circuitries, respectively, and the third lower metal line being in the peripheral region;
first and second photodiode patterns on the insulating layer and separated in each pixel by a gap region, the first and second photodiode patterns being electrically connected to the first and second lower metal lines, respectively;
a second device isolation layer on the insulating layer and the first and second photodiode patterns, the second device isolation layer having a first via hole partially exposing the first photodiode pattern and a second via hole exposing the third lower metal line;

an upper metal line on the second device isolation layer, electrically connected with the first photodiode pattern and the third lower metal line through the first via hole and the second via hole, respectively;

a pad hole in the second device isolation layer and the insulating layer to expose the pad; and a passivation layer over the second device isolation layer, the upper metal line, and the pad.

2. The image sensor of claim 1, wherein the second photodiode pattern is connected with the second readout circuitry, and is configured to measure or estimate a reference voltage.

3. The image sensor of claim 1, wherein the upper metal line covers the second photodiode pattern.

4. The image sensor of claim 1, wherein the first and second readout circuitries comprise an electrical junction region in the semiconductor substrate, and the electrical junction region comprises:

a first conductive type ion implantation region in the semiconductor substrate; and a second conductive type ion implantation region on the first conductive type ion implantation region.

5. The image sensor of claim 4, further comprising a first conductive type connection region on the electrical junction region, the first conductive type connection region being electrically connected with the first and second lower metal lines.

6. The image sensor of claim 4, wherein the electrical junction region comprises a PNP junction.

7. The image sensor of claim 4, further comprising a first conductive type connection region at one side of the electrical junction region and electrically connected with the first and second lower metal lines.

8. The image sensor of claim 7, wherein the first conductive type connection region contacts a device isolation region and is connected with the electrical junction region.

9. The image sensor of claim 1, wherein the first and second readout circuitries comprise a transistor having a source, a drain and a potential difference therebetween.

10. The image sensor of claim 9, wherein the transistor is a transfer transistor, the drain of the transfer transistor is a floating diffusion region, and the source of the transfer transistor has an ion implantation concentration lower than that of the drain.

11. The image sensor of claim 1, wherein the passivation layer is in contact with the upper metal line and the second device isolation layer.

12. The image sensor of claim 11, wherein the passivation layer is in direct contact with the upper metal line, the pad, and an upper surface and sidewalls of the second device isolation layer.

13. The image sensor of claim 1, wherein the passivation layer has a thickness of about 1000 Å to about 2000 Å.

14. The image sensor of claim 13, wherein the passivation layer consists of a tetraethyl orthosilicate-based oxide layer.

15. The image sensor of claim 1, wherein the insulating layer comprises a lowermost conformal etch stop layer, a conformal buffer and/or gap-fill layer, a bulk dielectric layer, and a capping layer.

16. The image sensor of claim 15, wherein the etch stop layer consists of a silicon nitride layer, the buffer and/or gap-fill layer comprises silicon-rich oxide, a first tetraethyl orthosilicate-based oxide or a first undoped silicate glass, the bulk dielectric layer comprises a doped silicon oxide, and the capping layer comprises a second tetraethyl orthosilicate- or plasma silane-based silicon dioxide or a second undoped silicate glass.

17. The image sensor of claim 1, wherein the first, second, and third lower metal lines comprise a metal, an alloy, or a metal silicide material.

18. The image sensor of claim 1, wherein each of the first and second photodiode patterns comprises an n-type impurity layer and a p-type impurity layer thereon, the n-type impurity layer being thicker than the p-type impurity layer.

19. The image sensor of claim 18, wherein the plurality of metal layers comprise a adhesion and/or barrier layer, an aluminum or aluminum alloy layer thereon, and an adhesion, barrier, hillock suppression and/or antireflective layer on the aluminum or aluminum alloy layer.

20. The image sensor of claim 18, wherein the metal contact comprises an adhesion and/or barrier layer and tungsten, aluminum or an aluminum alloy on the adhesion and/or barrier layer.

* * * * *